United States Patent

[11] 3,573,643

[72] Inventor Corwin E. Livenick Hickory Hills, Ill.
[21] Appl. No. 885,122
[22] Filed Dec. 15, 1969
[45] Patented Apr. 6, 1971
[73] Assignee Motorola, Inc. Franklin Park, Ill.

[54] FREQUENCY DISCRIMINATOR CIRCUIT INCLUDING PIEZOELECTRIC RESONATOR PROVIDING COUPLED RESONANT CIRCUIT
8 Claims, 3 Drawing Figs.

[52] U.S. Cl. .......... 329/117, 307/233, 329/142, 329/198
[51] Int. Cl. .......... H03d 3/26, H03d 3/16
[50] Field of Search .......... 329/117, 142, 198; 325/349; 307/233

[56] References Cited
UNITED STATES PATENTS
2,312,079 2/1943 Crosby .......... 329/117X

*Primary Examiner*—Alfred L. Brody
*Attorney*—Mueller, Aichele and Rauner

ABSTRACT: Frequency discriminator including piezoelectric element with first set of plates forming input tuned circuit and second pair of plates connected in a second tuned circuit coupled through the piezoelectric element to the first tuned circuit. The second tuned circuit includes an adjustable inductance for tuning to resonance at the center frequency of the frequency-modulated signal. The input signal is applied to the second tuned circuit and combined with opposite phases of the signal coupled through the piezoelectric element. A pair of rectifiers couple the second tuned circuit to a load across which the modulation signal is developed.

INVENTOR
CORWIN E. LIVENICK
BY
Mueller, Aichele & Rauner
ATTYS.

FREQUENCY DISCRIMINATOR CIRCUIT INCLUDING PIEZOELECTRIC RESONATOR PROVIDING COUPLED RESONANT CIRCUIT

BACKGROUND OF THE INVENTION

It has been common practice in frequency discriminator circuits to couple the modulated wave through a transformer having windings tuned to the center frequency of the modulated wave. Circuits commonly referred to as Foster-Seeley circuits combine the opposite phases of the signal applied through the transformer with the input signal so that shifting of the phase of the signal through the transformer as the frequency changes will change the amplitude of the combined signals. The combined signals are separately rectified and coupled to a load having a time constant such that the modulating signal is developed thereacross. As one combined signal increases and the other decreases with change in frequency, the rectified signals can be differentially combined to provide an additive output.

Discriminator circuits including transformers are objectionable in that the transformer is relatively large and expensive. The use of solid-state devices has resulted in substantial reduction in size of electronic circuits, and in a frequency modulation receiver the discriminator transformer may represent a substantial portion of the size of the entire receiver. Further it is necessary to tune the windings of the transformer to provide the desired frequency-discriminating action. This involves the use of a greater number of capacitors which may also be of relatively large size. Discriminators including transformers have the problem that many of the response characteristics vary with operating conditions, such as temperature and voltage, and this may affect the fidelity of the reproduced modulation signal.

Although it has been proposed to use piezoelectric resonating elements in frequency discriminator circuits, there has been a problem that such circuits have had very severe bandwidth limitations. Further such circuits inherently have not had the desired linear characteristics.

SUMMARY OF THE INVENTION

It is, therefore, an object of the present invention to provide the compact and inexpensive frequency discriminator circuit.

Another object of the invention is to provide a frequency discriminator circuit including a piezoelectric resonating element for frequency stability and which provides a linear response.

A further object of the invention is to provide a frequency discriminator circuit which does not utilize a transformer in the resonant circuits and to provide coupling therebetween.

Still another object of the invention is to provide a frequency discriminator including piezoelectric crystal elements wherein the bandwidth is sufficient for use in frequency modulation receivers for recovery of audio modulation.

A feature of the invention is the provision of a frequency discriminator including a piezoelectric element with a first set of plates forming a tuned input circuit and a second set of plates coupled to reactance elements to form a second tuned circuit, wherein signals are coupled through the piezoelectric element from the input circuit to the second circuit.

A further feature of the invention is the provision of a frequency discriminator including a crystal resonator with signals coupled between a set of input plates and a second set of plates, and with an inductor coupled to the second set of plates to tune out the capacity of the crystal to provide the desired bandwidth and linear response.

In practicing the invention, a frequency discriminator is provided including a piezoelectric resonator, such as a quartz crystal, having a first input set of plates connected to an input tuned circuit to which an angle-modulated signal is applied. The signal is coupled through the resonator to a second set of plates connected in a second tuned circuit with an inductor which is adjustable for precise tuning of the circuit to the center frequency of the applied signal. Signals are also applied from the input circuit to a centerpoint on the second tuned circuit so that the input signals are combined with opposite phases of the signals coupled through the resonator to produce signals varying in amplitude with changes in frequency of the applied signal. The two signals varying in amplitude are separately rectified and then differentially combined to provide the modulation signal across the load impedance. The load impedance has a time constant selected to permit the desired signal to develop thereacross.

DETAILED DESCRIPTION

Figure 1:
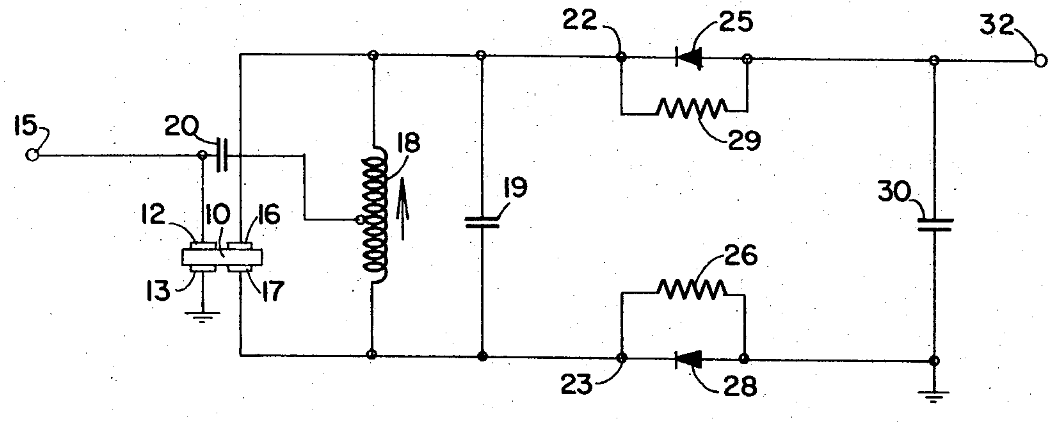
FIG. 1 is a circuit diagram of the frequency discriminator of the invention.

In FIG. 1 there is shown the circuit of a frequency discriminator which may be used to derive the modulation signal from a frequency-modulated wave. This circuit can be used in a frequency modulation receiver wherein a carrier wave is frequency modulated to transmit intelligence. The carrier wave has a center frequency $f_0$ and the frequency varies symmetrically above and below this frequency. A flat piezoelectric plate 10 has a first pair of electrodes 12 and 13 on opposite sides thereof. The piezoelectric plate is cut so that the natural resonant frequency of the plate with the electrodes 12 and 13 thereon is the frequency $f_0$ which is the center frequency of the modulated wave to be applied thereto. This wave is applied between the terminal 15 and ground, and is therefore impressed across the plates 12 and 13 on the resonator 10.

A second pair of plates 16 and 17 are provided on opposite sides of the resonator 10, and are spaced from the plates 12 and 13 so there is no direct electrical connection therebetween. Connected across the plates 16 and 17 is an inductor 18 and a capacitor 19. The inductor 18 is variable so that it can be adjusted to tune the circuit including the plates 16 and 17 and the capacitor 19. The inductor 18 acts to tune out the capacity of the crystal and the plates 15 and 17, so that the second tuned circuit is resonant precisely at the frequency $f_0$. It is to be pointed out that capacitor 19 may not be required in the circuit in all cases.

The piezoelectric plate 10 through its internal vibrations couples signals from the input tuned circuit including plates 12 and 13 to the second tuned circuit including plates 16 and 17. Signals so coupled are shifted in phase between the input circuit and the second circuit. Signals are also coupled from the input terminal 15 through capacitor 20 to a center tap on inductor 18. The signals so coupled are combined with the signals coupled through the resonator 10 which are of one polarity at the plate 16 and of the opposite polarity at the plate 17. At the center frequency $f_o$, the signals coupled through capacitor 20 have a 90° phase relationship with the signals at plate 16 and also a 90° phase relationship with the signals at plate 17. These combined signals appear at points 22 and 23. The signals at point 22 are rectified by diode 25, with the circuit being completed by resistor 26. The signals at point 23 are rectified by diode 28, the circuit being completed by resistor 29. The signals are differentially combined across capacitor 30 which bypasses the carrier wave including a band of frequencies about the center frequency $f_0$. The modulating signals are developed across capacitor 30 and applied to output terminal 32.

Figure 2:
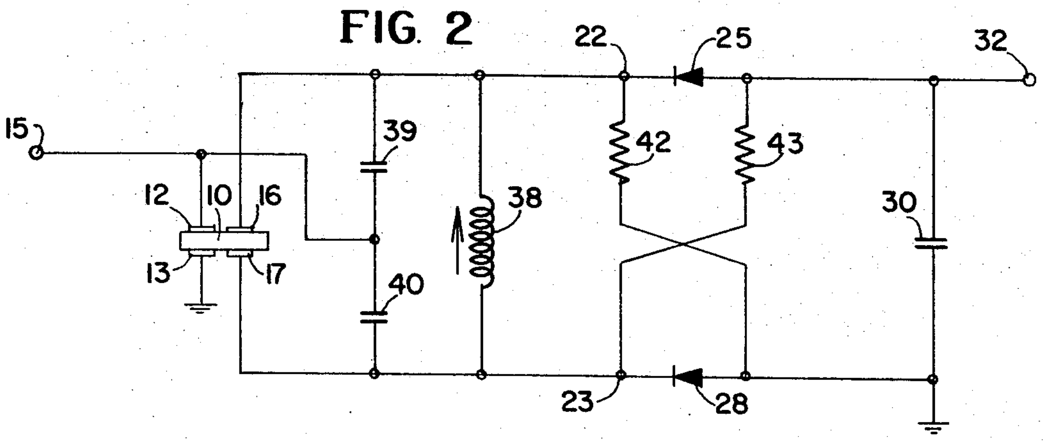
FIG. 2 is a circuit diagram of a second embodiment of the frequency discriminator of the invention.

The circuit of FIG. 2 is generally the same as the circuit of FIG. 1, and like parts have been given the same numbers. In this circuit, the signals coupled from the input terminal 15 are applied directly to the junction between the capacitors 39 and 40. Because of the coupling to capacitors 39 and 40, a capacitor, such as the capacitor 20 of the circuit of FIG. 1, is not needed for direct current isolation. The capacitors 39 and 40 provide an intermediate terminal in the second tuned circuit for the application of the input signal, whereas in the circuit of FIG. 1 the inductor 18 has an intermediate tap to which the input signal is applied. In FIg. 2, the inductor is variable to tune the circuit as in the circuit of FIG. 1. IN FIG. 2, resistors 42 and 43 for completing the rectifier circuit are connected across the two circuit branches, rather than directly across the diodes 25 and 28 as in the circuit of FIG. 1. Either connection arrangement can be used in either circuit.

Figure 3:
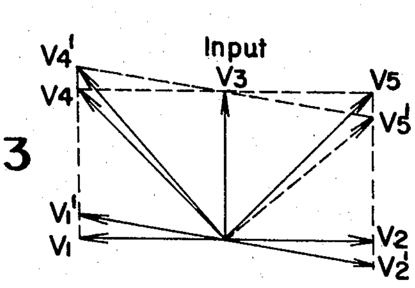
FIG. 3 is a vector diagram illustrating the operation of the circuits of FIGS. 1 and 2.

FIG. 3 is a vector diagram illustrating the operation of the circuit of FIGS. 1 and 2. Vectors $V_1$ and $V_2$ represent the voltages coupled through the piezoelectric element 10 and appearing on the plates 16 and 17. Vector $V_3$ represents the voltage coupled from the input terminal 15 to the tuned circuit. The voltages $V_1$ and $V_2$ coupled through the element 10 are essentially in phase quadrature with the voltage $V_3$. The voltage $V_3$ combines with the voltage $V_1$ to produce the voltage $V_4$ at point 22 in the circuits of FIGS. 1 and 2, and the voltage $V_3$ combines with the voltage $V_2$ to provide the voltage $V_5$ at point 23 in the circuits.

When the frequency of the input signal changes, the action of the resonator 10 and the tuned circuits coupled thereto causes the phase of the voltages on plates 16 and 17 to change as illustrated by the vectors $V'_1$ and $V'_2$. This causes the combined voltages to change as represented by the vectors $V'_4$ and $V'_5$. It will be noted that the vector $V'_4$ is larger than vector $V_4$ and the vector $V'_5$ is smaller than the vector $V'_5$. When these voltages are differentially combined a cumulative change in output voltage is produced at terminal 32.

The frequency discriminator circuit described has been found to provide effective operation in a frequency modulation receiver, and can be provided in very compact form. The piezoelectric element eliminates the coupling transformer and tuning capacitors coupled thereto to greatly reduce the number of components, and to substantially reduce the size. The discriminator circuit has been found to provide a linear response and sufficient sensitivity for satisfactory operation in a frequency modulation communications receiver.

I claim:

1. A frequency discriminator circuit for deriving modulation signals from an angle-modulated carrier wave having a given center frequency including in combination, a flat piezoelectric element, a first pair of conducting plates on opposite sides of said element and forming therewith a first tuned circuit resonant at the given center frequency, input circuit means coupled to said first pair of plates for applying the modulated carrier wave thereto, a second pair of conducting plates on opposite sides of said element and spaced from said first pair of plates, reactance means connected to said second pair of plates and cooperating therewith and with said element to form a second tuned circuit resonant at the given center frequency, said piezoelectric element coupling signals from said first tuned circuit to said second tuned circuit with a predetermined phase relation, coupling means connecting said input circuit to said second tuned circuit for coupling signals thereto with a phase relation different from said predetermined phase relation, and a rectifier circuit including first and second rectifier means and a rectifier load circuit, said first and second rectifier means individually connecting said plates of said second pair to said rectifier load circuit, whereby a signal is developed across said load circuit in response to modulation of the carrier wave.

2. The circuit of claim 1 wherein said reactance means includes inductor means connected between said conducting plates of said second pair, and said inductor means is variable to provide precise adjustment of the resonant frequency of said second tuned circuit.

3. The circuit of claim 1 wherein said rectifier load circuit includes a capacitor for bypassing signals having frequencies in a range including the given center frequency.

4. The circuit of claim 1 wherein said signals coupled through said piezoelectric element to said second tuned circuit appear at said conducting plates of said second pair with opposite phases, and signals of said given center frequency coupled through said coupling means appear at said plates of said second pair substantially in phase quadrature with the signals coupled thereto through said piezoelectric element.

5. The circuit of claim 4 wherein said reactance means includes an inductor connected between said conducting plates of said second pair and having an intermediate tap thereon, and said coupling means is connected to said center tap for coupling signals thereto from said input circuit.

6. The circuit of claim 5 wherein said inductor is variable to provide precise adjustment of the resonant frequency of said second tuned circuit.

7. The circuit of claim 4 wherein said reactance means includes first and second capacitors connected in series between said conducting plates of said second pair, and said coupling means is connected to the connection between said capacitors for coupling signals thereto from said input circuit.

8. The circuit of claim 7 wherein said reactance means includes a variable inductor connected in parallel with said first and second capacitors to provide precise adjustment of the resonant frequency of said second tuned circuit.